United States Patent
Smith et al.

(10) Patent No.: US 8,289,674 B2
(45) Date of Patent: Oct. 16, 2012

(54) MOVING A FREE-STANDING STRUCTURE BETWEEN HIGH AND LOW ADHESION STATES

(75) Inventors: Charles Gordon Smith, Cambridge (GB); Richard L. Knipe, McKinney, TX (US)

(73) Assignee: Cavendish Kinetics, Ltd., London (GB)

( * ) Notice: Subject to any disclaimer, the term of this patent is extended or adjusted under 35 U.S.C. 154(b) by 744 days.

(21) Appl. No.: 12/405,758

(22) Filed: Mar. 17, 2009

(65) Prior Publication Data

US 2010/0237738 A1 Sep. 23, 2010

(51) Int. Cl.
*H01H 47/00* (2006.01)

(52) U.S. Cl. ........................................ 361/271; 361/207

(58) Field of Classification Search .................. 361/207, 361/271, 278; 310/309
See application file for complete search history.

(56) References Cited

U.S. PATENT DOCUMENTS

| | | | |
|---|---|---|---|
| 4,674,180 A | 6/1987 | Zavracky et al. | |
| 5,280,277 A | 1/1994 | Hornbeck | |
| 5,677,823 A | 10/1997 | Smith | |
| 6,115,231 A | 9/2000 | Shirakawa | |
| 6,229,683 B1 | 5/2001 | Goodwin-Johansson | |
| 6,294,847 B1 | 9/2001 | De Los Santos | |
| 6,473,361 B1 | 10/2002 | Chen et al. | |
| 6,509,605 B1 | 1/2003 | Smith | |
| 6,646,215 B1 | 11/2003 | Nelson | |
| 6,744,338 B2 | 6/2004 | Nikitin | |
| 6,856,068 B2 | 2/2005 | Miller et al. | |
| 7,586,238 B2 * | 9/2009 | Liu | 310/328 |
| 2002/0075094 A1 | 6/2002 | Bechtle et al. | |
| 2002/0097136 A1 | 7/2002 | Coleman et al. | |
| 2005/0127792 A1 * | 6/2005 | Mehta | 310/332 |
| 2008/0074725 A1 * | 3/2008 | Pan | 359/291 |

FOREIGN PATENT DOCUMENTS

| | | |
|---|---|---|
| EP | 1227496 A1 | 7/2002 |
| WO | WO-99/63559 A1 | 12/1999 |
| WO | WO-2005/124803 A1 | 12/2005 |
| WO | WO-2008032069 A1 | 3/2008 |

OTHER PUBLICATIONS

Invitation to Pay Additional Fees with Partial International Search Report for PCT/US2010/027603 (CK060PCT) dated Jul. 7, 2010.
Lei I. Mercado et al., "A Mechanical Approach to Overcome RF MEMS Switch Stiction Problem" 2003 Proceedings 53rd. Electronic Components and Technology Conference (ECTC) New Orleans, LA May 27-30, 2003 (pp. 377-384), XP010648345 New York, NY IEEE, US ISBN: 0-7803-7991-5 Sections "Determine the Stiction Force" ADN "Conclusions" From p. 380, Left Column—p. 383, Left Column.
Notification of the Second Office Action for Chinese Patent Application No. 200580017696.7 dated May 8, 2009.
Notification of the First Office Action dated Nov. 14, 2008 for Chinese Patent Application No. 200580017698.7.
PCT International Search Report for PCT/EP2005/005484 dated Dec. 20, 2006.

(Continued)

*Primary Examiner* — Danny Nguyen
(74) *Attorney, Agent, or Firm* — Patterson & Sheridan, LLP

(57) ABSTRACT

Embodiments disclosed herein generally solve a stiction problem in switching devices by using a series of pulses of force which take the switch from being strongly adhered to a landing electrode to the point where it is only weakly adhered. Once in the low adhesion state, the switch can then be pulled away from contact with a lower force provided by either the spring constant of the switch and/or the electrostatic forces resulting from low voltages applied to nearby electrodes.

20 Claims, 11 Drawing Sheets

OTHER PUBLICATIONS

Zhao et al., "An Asperity Microcontact Model Incorporating the Transition from Elastic Deformation to Fully Plastic Flow", Trans of the ASME vol. 122 (2000), pp. 86-93.

Johnson et al., "Surface Energy and the Contact of Elastic Solids", Proc. R. Soc. Lond. A 1791 324, 301-313.

Muller, "On the Influence of Molecular Forces on the Deformation of an Elastic Sphere and Its Sticking to a Rigid Plane" Journal of Colloid and Interface Science, vol. 77, No. 1, Sep. 1980.

Rose, "Universal Binding Energy Curves for Metals and Bimetallic Interfaces", Physical Review Letters, vol. 47, No. 9 (1981).

Chen, "A Universal Relation in NC-AFM, STM, and Atom Manipulation", Nanotechnology 16 (2005) S27-S34.

International Search Report and Written Opinion for PCT/US2010/027603 (CK060PCT) dated Aug. 12, 2010.

* cited by examiner

US 8,289,674 B2

MOVING A FREE-STANDING STRUCTURE BETWEEN HIGH AND LOW ADHESION STATES

BACKGROUND OF THE INVENTION

1. Field of the Invention

Embodiments of the present invention generally relate to a free standing structure such as a switch or cantilever and a method of moving the free standing structure between high and low adhesion states.

2. Description of the Related Art

As the size of semiconductor devices continues to shrink, so does the size of micro-electromechanical (MEMS) devices that are coupled to the semiconductors. MEMS devices may be used as miniature relay switches, capacitance switches, non-volatile memory elements and for many more applications. The MEMS devices have a switch or cantilever that moves between at least two positions to either permit or deny a current from flowing through the switch. In other MEMS devices the cantilever moves between being in contact with a landing electrode to not being in contact. In some of these devices no current flows, but a change in the capacitance of the landing region occurs.

MEMS devices are made using similar processing steps to those found in semiconductor foundries and therefore can be manufactured cost effectively on a wafer scale. One of the issues found in shrinking MEMS devices to the scale of less than a few micrometers is that the adhesion forces begin to be large in comparison to other restoring forces in the devices. These restoring forces are usually the spring restoring force of the MEMS device itself or electrostatic forces used to pull the MEMS device out of intimate contact with a substrate, for the case of a simple cantilever. The adhesion forces depend on the surface chemistry, but include van der Waals forces, electrostatic forces from fixed charges, covalent bonding and metal-metal bonding for the case of two conducting surfaces. Once the adhesion forces become larger than the restoring forces, the device may undesirably remain in contact with the substrate.

Therefore, there is a need in the art for a method of overcoming adhesion forces in MEMS devices.

SUMMARY OF THE INVENTION

Embodiments disclosed herein generally solve a stiction problem in switching devices by moving the switch from a state of high adhesion to a landing electrode to a state of low adhesion to the landing electrode. Once in the low adhesion state, the switch can then be pulled away from contact with a lower force provided by either the spring constant of the switch and/or the electrostatic forces resulting from low voltages applied to nearby electrodes.

In one embodiment, a method of moving a switch in a micro-electromechanical device is disclosed. The method includes applying one or more pulses of first voltage to a first electrode to move the switch from a first position in contact with a second electrode where the switch is in a state of high adhesion with the second electrode to a second position different than the first position and in contact with the second electrode where the switch is in a state of low adhesion with the second electrode. The switch remains in contact with the second electrode during the movement from the first position to the second position. The one or more pulses of first voltage are each applied for a first period of time. The method may also include applying a second voltage to a third electrode to move the switch from the second position to a third position spaced from the second electrode. The second voltage may be applied for a second period of time that is greater than the first period of time.

In another embodiment, a method of moving a switch in a micro-electromechanical device is disclosed. The method includes applying a first voltage for a first period of time to a first electrode to move the switch from a first position spaced from a second electrode to a second position in contact with the second electrode, where the switch is in a state of low adhesion with the second electrode. The method also includes applying one or more pulses of a second voltage to the first electrode to move the switch from the second position to a third position in contact with the second electrode, where the switch is in a state of high adhesion with the second electrode. The switch remains in contact with the second electrode while moving from the second position to the third position. Each pulse may be applied for a second period of time less than the first period of time.

In another embodiment, a method of moving a switch in a micro-electromechanical device is disclosed. The method includes applying a first voltage for a first period of time to a first electrode to move the switch from a first position spaced from the first electrode to a second position in contact with the first electrode, wherein the switch is in a state of low adhesion with the first electrode. The method may also include applying one or more pulses of a second voltage to the first electrode to move the switch from the second position to a third position in contact with the first electrode, where the switch is in a state of high adhesion with the first electrode at the third position. The switch remains in contact with the first electrode while moving from the second position to the third position. Each pulse may be applied for a second period of time less than the first period of time.

In another embodiment, a method of operating a MEMS device is disclosed. The method includes applying a first voltage to a first electrode to move a switch from a first position spaced from landing area and a second position in contact with the landing area and measuring the resistance through the switch at the second position. The method may also include applying a second voltage to the first electrode to move the switch from the second position to a third position different than the second position and measuring the resistance through the switch at the third position.

In another embodiment, a method of operating a MEMS device is disclosed. The method includes applying a first voltage to a first pull-in electrode to bring a rocker plate into contact with a first landing electrode. The MEMS device includes the rocker plate coupled to a pivot contact, the first landing electrode spaced from the pivot contact, the first pull-in electrode disposed between the pivot contact and the first landing electrode, a second landing electrode spaced from the pivot contact and a second pull-in electrode disposed between the pivot contact and the second landing electrode. The method also includes measuring the first resistance through the rocker plate and applying one or more pulses of a second voltage to the first pull-in electrode. The method additionally includes measuring the second resistance through the rocker plate and applying one or more pulses of a third voltage to the first pull-in electrode. The method also includes measuring the third resistance through the rocker plate and applying a fourth voltage to the second pull-in electrode to move the rocker plate out of contact with the first landing electrode.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally solve a stiction problem in switching devices by using pulses of electrical voltage which take the switch from being strongly adhered to a landing electrode to the point where it is only weakly adhered. Once in the low adhesion state, the switch can then be pulled away from contact with a lower force provided by either the spring constant of the switch and/or the electrostatic forces resulting from low voltages applied to nearby electrodes. There is no need to pivot the switch off of the landing electrode with an additional, contacting and/or fulcrum electrode positioned between the landing electrode and the electrode connecting the switch to electrical contacts below the switch.

The embodiments will be illustrated by considering an electrostatically actuated cantilever device, which can act as a relay, which is either in contact with the landing electrode or spaced therefrom. When the device is in contact with the landing electrode, electrical connection is made between the landing electrode and the cantilever. Such a bi-stable device can be used as a non-volatile element, for example, where the cantilever is either in contact with low resistance between the cantilever and the landing electrode or spaced therefrom with higher resistance between the cantilever and the landing electrode. The embodiments are not limited to such devices and can be used in any MEMS device that has stiction or adhesion during its operation.

While referred to as a switch or cantilever throughout the application, it is to be understood that the MEMS device may comprise not just a cantilever with a fixed end and a free end, but also a two way switch pivoting in the middle like a see-saw and a three way switch.

Figure 1A:
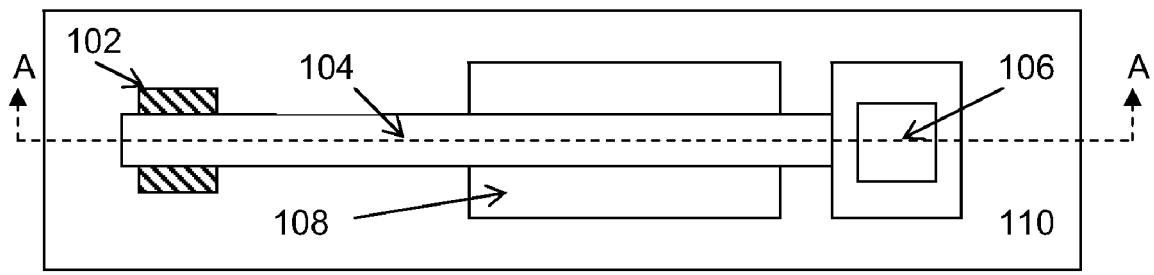
FIG. 1A is a top view of a MEMS device according to one embodiment.
Figure 1B:
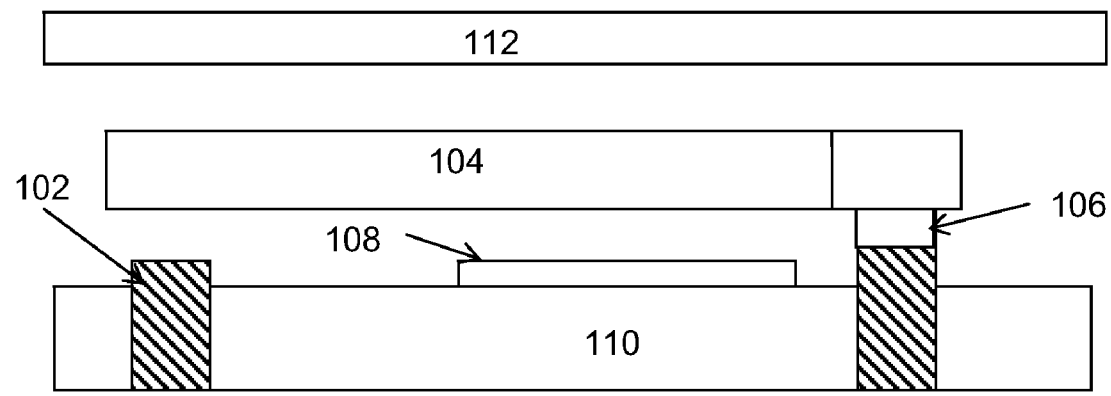
FIG. 1B is a cross sectional view of the MEMS device of FIG. 1A taken along line A-A showing the cantilever 104 spaced from the landing electrode 102.
Figure 1C:
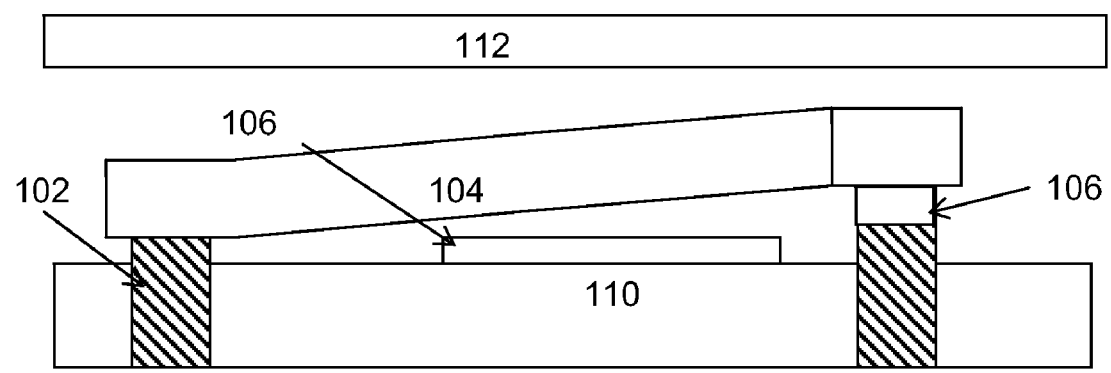
FIG. 1C is a cross sectional view of the MEMS device of FIG. 1A taken along line A-A showing the cantilever 104 in contact with the landing electrode 102.

With reference to FIGS. 1A-1C, a MEMS device according to one embodiment is shown. The MEMS device may be formed at any point within the structure. For example, the MEMS device may be formed above a complementary metal oxide semiconductor (CMOS) structure. Additionally, the MEMS device may be formed within a stack such that additional layers of the structure (i.e., not the MEMS device) may be present above the MEMS device. The MEMS device may be used in the back end of the line (BEOL) processing of a metal system. In addition the MEMS device could be formed in the BEOL of a bipolar process or a III/V or II/IV system.

The MEMS device comprises a cantilever or switch 104 formed over a structure. The topmost layer shown for the structure is a dielectric layer 110. It is to be understood that the topmost layer may comprise any other layer that is typically present within a structure. In one embodiment, the dielectric layer 110 may comprise silicon dioxide. In one embodiment, the switch 104 may comprise a conductive material. In one embodiment, the switch 104 may comprise titanium nitride. In other embodiments, the switch 104 may comprise conductive materials such as a titanium aluminum compound, a titanium aluminum nitride compound, polysilicon, silicon, and combinations thereof. In another embodiment the switch 104 may comprise a combination of conducting and insulating parts.

The contact bump or landing electrode 102 is the region where the cantilever or switch 104 lands. A contact bump or landing electrode 102 is not required to makes a MEMS device work, but it is often found in MEMS devices to limit the contact area. In this embodiment, the contact bump or landing electrode 102 is connected by a via through the dielectric layer 102, which could be the interlayer dielectric of a CMOS device, to an underlying metallization layer that could also be found in the back end of a CMOS device.

The vias are fabricated using known methods such as conventional lithography and etch processes. The vias may comprise a liner layer and a metal fill. In one embodiment, the liner may comprise titanium. In another embodiment, the liner may comprise titanium nitride. In one embodiment, the fill material may comprise tungsten. In another embodiment, the fill material may comprise copper. In another embodiment, the fill material may comprise aluminum. The vias may be capped with a titanium and/or titanium nitride layer. The titanium and/or titanium nitride layer may be patterned using conventional lithography and etch processes to form a plurality of electrodes, one of which will be the lower electrode of the MEMS cantilever device. It is to be understood that the embodiments discussed herein do not require a CMOS process, as any wafer scale metallization process would be sufficient.

The switch 104 may be mounted to an anchor 106 that is connected through a via to lower levels of the structure. The anchor 106 may be conductive to permit a current to flow through the via and the switch 104. A pull down electrode 108 may be present over the dielectric layer 110 and between the landing electrode 102 and the anchor 106. The pull down electrode 106 may be charged up to a fixed voltage or have a train of time-varying voltage pulses applied to it to induce movement of the switch 106. A pull up electrode 112 may also be present above the switch 104 to induce movement of the switch 104 as well. The pull up electrode 112 is an optional conducting electrode and may be charged up to a fixed voltage or have a train of time varying voltage pulses applied to it.

The device can be moved from a position spaced from the landing electrode 102 to a position in contact with the landing electrode 102 by applying a voltage to the pull down electrode 108 while the switch 104 is supported and grounded through the anchor 106. Sufficient voltage may be applied to the pull down electrode 108 to induce the switch 104 to move into contact with the landing electrode 102. The switch 104 may remain in contact with the landing electrode 102 even when no voltage is applied to the pull down electrode 108 and thus be stuck due to stiction.

The state of being stuck down as shown in FIG. 1C can be maintained when the voltage on pull down electrode 108 is reduced to zero, because the adhesion force at the contact region where switch 104 touches landing electrode 102 is larger than the pull up spring force from the bend in the switch 104. The state of the switch 104 can be deduced by measuring the resistance between the switch 104 and the landing electrode 102. For the switch 104 to stay down, the adhesion force has to be larger than the restoring spring force resulting from the bending of the switch 104 away from the straight form shown in FIG. 1B.

To understand how the adhesion force may be controllably altered, consider what the contact between the switch 104 and the landing electrode 102 looks like on a microscopic scale. On a microscopic scale, the contact surfaces have asperities 202, 204 which provide surface roughness on a number of length scales. This means that when the two surfaces come in contact, the roughness ensures that initially only the tops of the asperities touch. With the application of more force the asperities are deformed either elastically or in-elastically. This deformation increases the area in intimate contact.

Figure 2A:
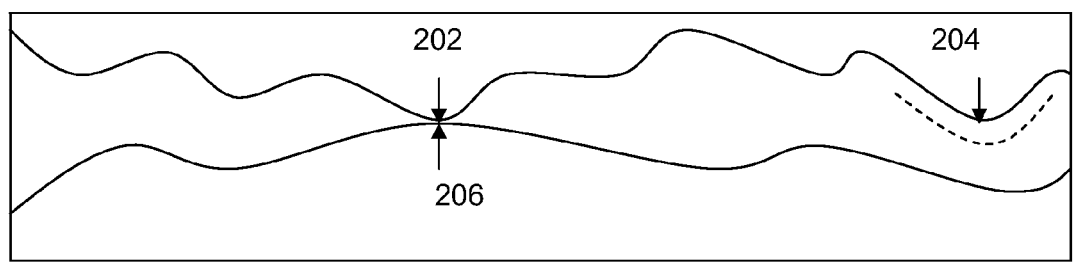
FIG. 2A shows a schematic close up of the contact region showing an asperity in intimate contact between a switch and a landing electrode.
Figure 2B:
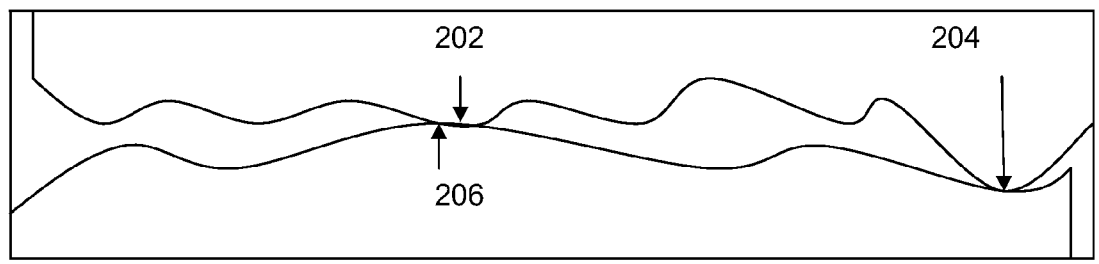
FIG. 2B shows the contact region after greater attractive pressure is applied between the switch and the landing electrode shown in FIG. 2A.

With reference to FIGS. 2*a* and 2*b* we can see that the two adhesion states are related to two different contact areas with more asperities touching in the high adhesion state. When using material with a good conducting surface such as TiN or Ruthenium or Ruthenium oxide or a noble metal such as gold or platinum, then the resistance through the contact area between the landing electrode and the cantilever will be inversely proportional to the contact area. Thus a large area contact will have a high adhesion force and a low resistance and the low adhesion state will have a small contact area and a high resistance. Thus it is possible to measure the transition from the high adhesion state to the low adhesion state by measuring the change in resistance of the contact from the low resistance state to the high resistance state. This gives us a way of ensuring we reach the low adhesion sate during the resonant release. For a given set of devices there will be a good correlation between the resistance of the cantilever contact interface and the adhesions. This is because both the resistance and the adhesion are proportional to the microscopic contact area of all the asperities in close contact. The tunneling current between two metals drops off exponentially with distance with the current dropping by a factor of 10 for every 0.1 nm increase in gap spacing. This means that only the surfaces that are in intimate contact will contribute to the transport. In addition the strongest adhesion force comes from metal-metal bonding between atoms. This also drops off with the same exponential decay because it is related to the tunnel coupling between the states in one surface and those in the other. Thus we can find a value of resistance for the contact above which we can say the cantilever is weakly stuck down. By ensuring that we agitate the cantilever to the point that the resistance is higher than this value then we can be sure the cantilever is in the low adhesion state.

Thus, to ensure we reliably move between the two adhesion states, we can apply the series of pulses to the pull in electrode to excite the cantilever into a resonant vibration for a given period of time, and then we can monitor the resistance of the contact to see if it has increased above our threshold value. If it has then we can reduce the pull in voltage and let the cantilever go. If the resistance is still too low we can apply a second set of pulses to the pull in electrode and again measure the new resistance state. This can be repeated until the resistance is above the desired level.

FIG. 2A shows a schematic close up of the contact region showing asperity 202 in intimate contact at point 206. Asperity 204 is not in contact. FIG. 2B shows the contact region after greater attractive force is applied between the switch and the landing electrode causing other asperities 202, 204 to come close enough for new asperities to form metal-metal bonds.

For metals, the metal-metal bonding forces drop off exponentially with increased distance so that these forces increase very quickly when the surfaces are pushed together. This has the effect of ensuring that when the surfaces are pushed together they stay together with this new increased intimate contact area shown in FIG. 2B.

If the amplitude of the asperities is not too large then the extra repulsive force resulting from compressing the asperities 202 which touch first is less than the extra force of attraction from the new asperities 204 coming into metal-metal bonding. The repulsive force caused by the compression of the asperities 204 increases inversely with the compression distance with a power law dependence. Because of the fast exponential attraction variation of adhesion with gap for metal-metal bonding, the attraction at point 206 is small when the separation is greater than the region marked with the dotted line in FIG. 2A and only asperity 202 stays in contact. If the surfaces are pushed together so that the gap between asperity 204 and the substrate is less than that marked by the dotted line in FIG. 2A, then the attractive force from metal-metal bonding at point 206 is able to overcome the repulsive force from compression of asperity 202 and a new, more strongly adhered contact results. This increased adhesion results in a small relative spatial movement between the two surfaces. This can be vertical, lateral or lateral and vertical. The strength of the metal-metal bonding force depends on the carrier concentration at the surface and increases with the carrier concentration Thus, it helps if the metal chosen does not contain any surface contamination or insulating barrier. It is also helpful if the metals have high hardness values so that they do not deform inelastically during compression and release.

The increased adhesion results in an increased contact area and very often this means that the resistance of the contact drops to a new low value. It also means that when the external force is removed the increased short range attractive forces keep the contact in a new, low resistance state. This state makes it hard to pull the switch off with a low pull off voltage because of the increased metal-metal bonding over the larger surface area.

In order to overcome this problem, a series of voltage pulses, between 1 pulse and approximately 100 can be applied to either the pull down electrode or the pull up electrode. By setting the pulse frequency to match the resonant frequency of the switch when it is stuck down, the switch starts to vibrate up and down with increasing amplitude, which in turn puts an oscillating sheer stress at the switch contact region where it is stuck down. Because the damping per oscillation is smaller than the extra mechanical energy added to the vibrating switch with each subsequent pulse, the amplitude of the vibration increases with each subsequent pulse.

The vibration up and down in the central portion of the switch can cause both an oscillation in the normal forces at the contact as well as sheer forces. These sheer forces cause the asperities under the greatest tensile stress to sheer apart. The strain is then released in that asperity and it pulls back to a second physical position that may also be laterally displaced by a small distance. The average separation also shifts by distances that may be less than 1 nanometer. Once it has pulled back, the adhesion from the metal-metal bonding drops off very quickly and the asperity is no longer in electrical contact. Other asperities that were under compression are then under less compression. This returns the switch to a state where it is weakly adhered to the landing electrode. Because fewer asperities are in contact, the contact resistance may also increase. The switch is now weakly adhering to the landing electrode and it can then be pulled apart with a low voltage applied to the pull up electrode. The voltage applied to the pull up electrode is smaller than would be necessary in absence of the pulsing.

Figure 3:
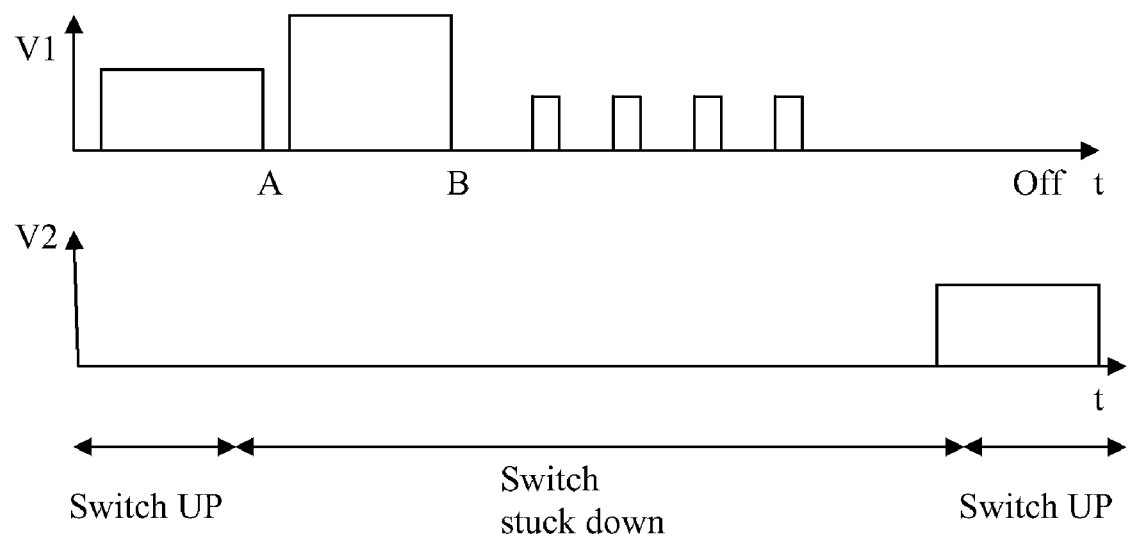
FIG. 3 shows the voltages applied to the pull down electrode and the pull up electrode according to one embodiment.

Referring to FIG. 3, the top trace shows a possible example of the voltage pulse V1 applied to the pull down electrode, while the switch is held at ground. The switch is forced into contact with the landing electrode which urges the asperity 202 into contact with the landing electrode with a low pull in voltage. The switch is then forced into greater contact such that asperity 204 is in contact with the landing electrode with a higher voltage applied to the pull down electrode. The switch moves from a high stiction level to a low stiction level after a set of voltage pulses are applied to the pull down electrode with a period equal to the mechanical period of oscillations of the portion of the switch between the landing electrode and the anchor. These oscillations cause the cantilever to vibrate with larger and larger amplitude which results in a larger and larger pull off force at the asperity. Thus, asperity 204 would not contact the landing electrode while asperity 202 would remain in contact with the landing electrode.

The lower trace shows the voltage applied to the pull up electrode that pulls the switch off the landing electrode after the switch has been moved into the low stiction state using the pulses applied to the pull down electrode. The pull up voltage is now able to overcome the weaker stiction forces and pull the electrode off the landing electrode. The voltage necessary to overcome the stiction forces is less than would otherwise be necessary in the absence of the pulsing to move to a weaker adhesion state. There are many alternative examples of how the voltage pulses can be applied to the pull up electrode and/or the pull down electrode.

In an alternative embodiment, the switch can be brought into weak adhesive contact by applying a voltage pulse to the pull down electrode while the switch is free-standing or stuck to the pull up electrode. The switch can then be pulled in further to a state where it is more strongly adhering to the landing electrode. By applying pulse trains at a frequency matching the cantilever resonant frequency on top of a continuous long voltage pulse background, the increased adherence may be obtained. This pulse sequence causes the switch to vibrate up and down, but the continuous pull down voltage ensures the switch does not come off when it vibrates up, but that it sticks more strongly when it vibrates down.

Figure 4:
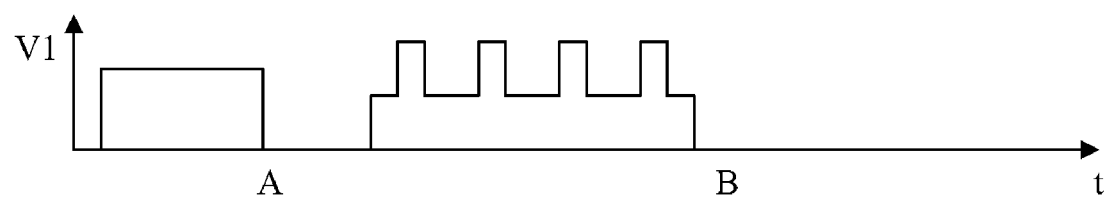
FIG. 4 shows the voltage applied to the pull down electrode according to one embodiment.

Referring to FIG. 4, a long voltage pulse V1 applied to the pull down electrode brings the switch into weak adhesive contact with the landing electrode such that the asperity 202 will be in contact with the landing electrode. A subsequent voltage pulse train on a continuous pull down voltage background at the resonant frequency of the stuck down switch will bring it into strong adhesive contact. The asperity 204 will thus be in contact with the landing electrode.

In another embodiment, a pulse train with a period equal to the period of vibration of the cantilever on resonance without the additional continuous background pull in voltage will cause the switch to move to the lower adhesion state that is slightly shifted spatially from the high resistance state. In this new state it can be pulled off with a voltage applied to the pull up electrode.

FIGS. 5-10 show examples of how a conducting switch or cantilever can be controllably taken between a high adhesion state and a low adhesion state contacting a landing electrode using a series of voltage pulses with a period designed to excite one or more resonant modes of the cantilever at one time. As noted above, to determine whether the switch of cantilever is in a high adhesion state or a low adhesion state, the resistance may be measured. A high resistance would indicate a low adhesion state. A low resistance would indicate a high adhesion state. In FIGS. 5-10, Va is the voltage applied to the pull down electrode, Vb the voltage applied to the switch or cantilever, Vc the voltage applied to landing electrode and Vd the voltage applied to pull up electrode. The voltages applied to the landing electrode generate a current from the landing electrode through the switch or cantilever, which can be used to measure the resistance between these two electrodes. If the resistance in less then 1 M Ohm, for example, then the switch or cantilever must be touching electrode the landing electrode, if the resistance is greater than 10 M Ohms, for example, it can be said to not be touching the landing electrode.

Figure 5:
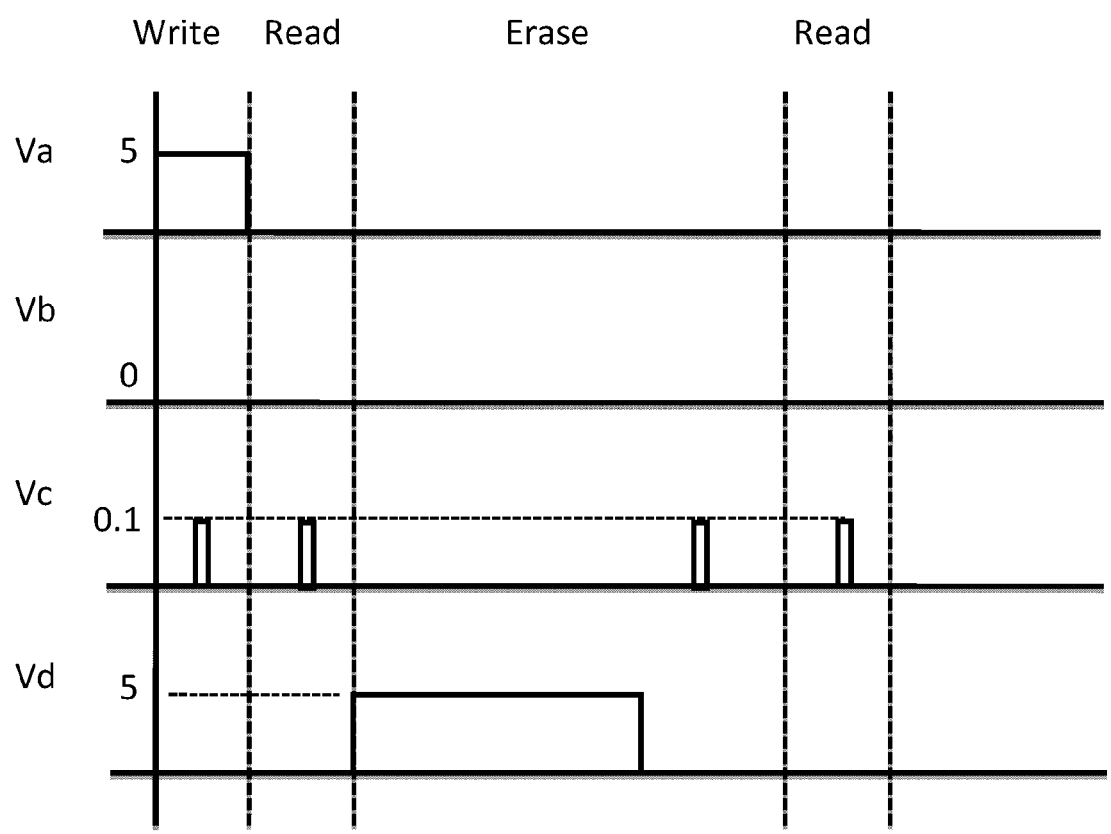
FIG. 5 shows a voltage application scheme according to one embodiment.

As shown in FIG. 5, during the write stage, a voltage is applied to the pull down electrode. In the embodiment shown in FIG. 5, a constant voltage of 5V is applied to the pull down electrode, no voltage is applied to the switch or cantilever, no voltage is applied to the pull up electrode, and a short pulse of 0.1 volts is applied to the landing electrode while the constant voltage is applied to the pull down electrode. The time period that the voltage is applied to the landing electrode is much shorter than the time period that the constant voltage is applied to the pull down electrode. Additionally, the ratio of the voltage applied to the pull down electrode to the landing electrode is shown to be 50:1. It is to be understood that other ratios are possible as the particular voltages used in FIG. 5 are for exemplification purposes only. The purpose of the voltage applied to the landing electrode during the write stage is to place a current through the switch or cantilever and thus, write the device. During the write stage, the switch or cantilever is pulled into contact with the landing electrode.

During the read stage, a pulse of low voltage is applied to the landing electrode to measure the resistance through the switch or cantilever. No voltage is applied to the pull down electrode or the pull up electrode.

During the erase stage, the switch or cantilever is pulled from contact with the landing electrode. A voltage is applied to the pull up electrode to move the switch or cantilever from a position in contact with the landing electrode to a position spaced from the landing electrode. In the embodiment shown in FIG. 5, a constant voltage of 5V is applied to the pull up electrode. The voltage applied to remove the switch or cantilever from the landing electrode is shown to be the same as the voltage that brings the switch or cantilever into contact with the landing electrode during the write stage. A voltage is applied to the landing electrode after the switch or cantilever is believed to have been moved out of contact with the landing electrode to erase the device. Thereafter, the device is read by applying a small voltage to the landing electrode to measure the resistance.

In each of the write, read, and erase stages, the voltage applied to the landing electrode is shown to be 0.1V, but it is to be understood that other voltages could be applied. Additionally, while the voltage applied to the pull down electrode and the pull up electrode is shown to be 5V each, it is to be understood that other voltages may be used. In FIG. 5, the voltage used to bring the switch or cantilever into contact with the landing electrode is shown to be a constant voltage. Likewise, the voltage used to pull the switch or cantilever from contact with the landing electrode is shown to be a constant voltage.

Figure 6:
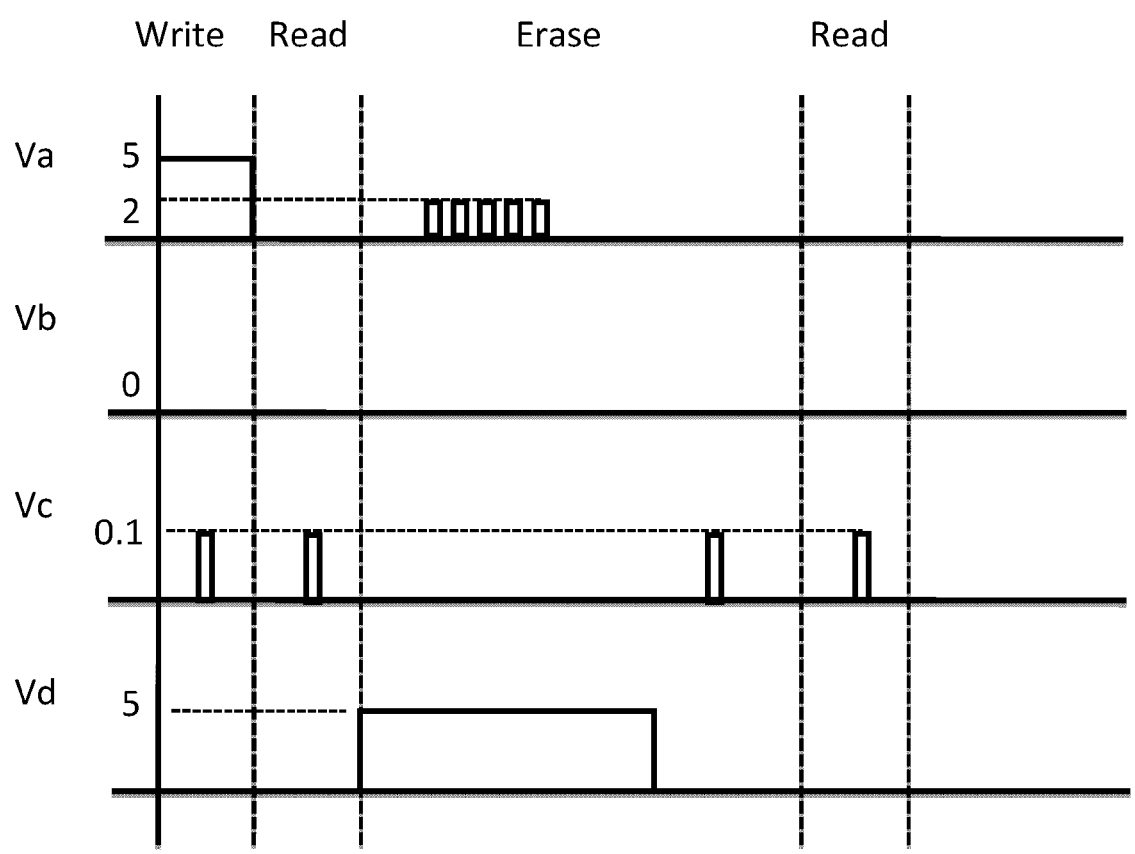
FIG. 6 shows a voltage application scheme according to another embodiment.

In FIG. 6, during the write stage, a voltage is applied to the pull down electrode. In the embodiment shown in FIG. 6, a constant voltage of 5V is applied to the pull down electrode, no voltage is applied to the switch or cantilever, no voltage is applied to the pull up electrode, and a short pulse of 0.1 volts is applied to the landing electrode while the constant voltage is applied to the pull down electrode. The time period that the voltage is applied to the landing electrode is much shorter than the time period that the constant voltage is applied to the pull down electrode. Additionally, the ratio of the voltage applied to the pull down electrode to the landing electrode is shown to be 50:1. It is to be understood that other ratios are possible as the particular voltages used in FIG. 6 are for exemplification purposes only. The purpose of the voltage applied to the landing electrode during the write stage is to place a current through the switch or cantilever and thus, write the device. During the write stage, the switch or cantilever is pulled into contact with the landing electrode.

During the read stage, a voltage pulse is applied to the landing electrode to measure the resistance through the switch or cantilever. No voltage is applied to the pull down electrode or the pull up electrode.

During the erase stage, the switch or cantilever is pulled from contact with the landing electrode. A constant voltage is applied to the pull up electrode to move the switch or cantilever from a position in contact with the landing electrode to a position spaced from the landing electrode. In the embodiment shown in FIG. 6, a constant voltage of 5V is applied to the pull up electrode. The voltage applied to remove the switch or cantilever from the landing electrode is shown to be the same as the voltage that brings the switch or cantilever into contact with the landing electrode, however, a voltage pulse is applied to the pull down electrode to aid in freeing the switch or cantilever from the landing electrode.

The pulse of voltage applied to the pull down electrode is shown to cycle between 0V and about 2V and is applied for 5 pulses or cycles at a frequency between about 15 MHz to about 40 MHz. The voltage pulse to the pull down electrode vibrates the switch or cantilever to move the switch or cantilever from a high state of adhesion with the landing electrode to a stage of lesser adhesion. It is to be understood that the number of pulses could be more or less than 5 as determined by the technician. By measuring the resistance, the state of adhesion may be determined. The voltage applied to the pull down electrode is less than the voltage applied to pull the switch or cantilever into contact with the landing electrode and less than the constant voltage applied to the pull up electrode. The voltage is applied to the pull up electrode for a time period longer than each individual pulse is applied to the pull down electrode.

A voltage is applied to the landing electrode after the switch or cantilever is believed to have been moved out of contact with the landing electrode to erase the device. Thereafter, the device is read by applying a small voltage to the landing electrode to measure the resistance.

In each of the write, read, and erase stages, the voltage applied to the landing electrode is shown to be 0.1V, but it is to be understood that other voltages could be applied. Additionally, while the constant voltages applied to the pull down electrode and the pull up electrode is shown to be 5V each, it is to be understood that other voltages may be used as well.

Figure 7:
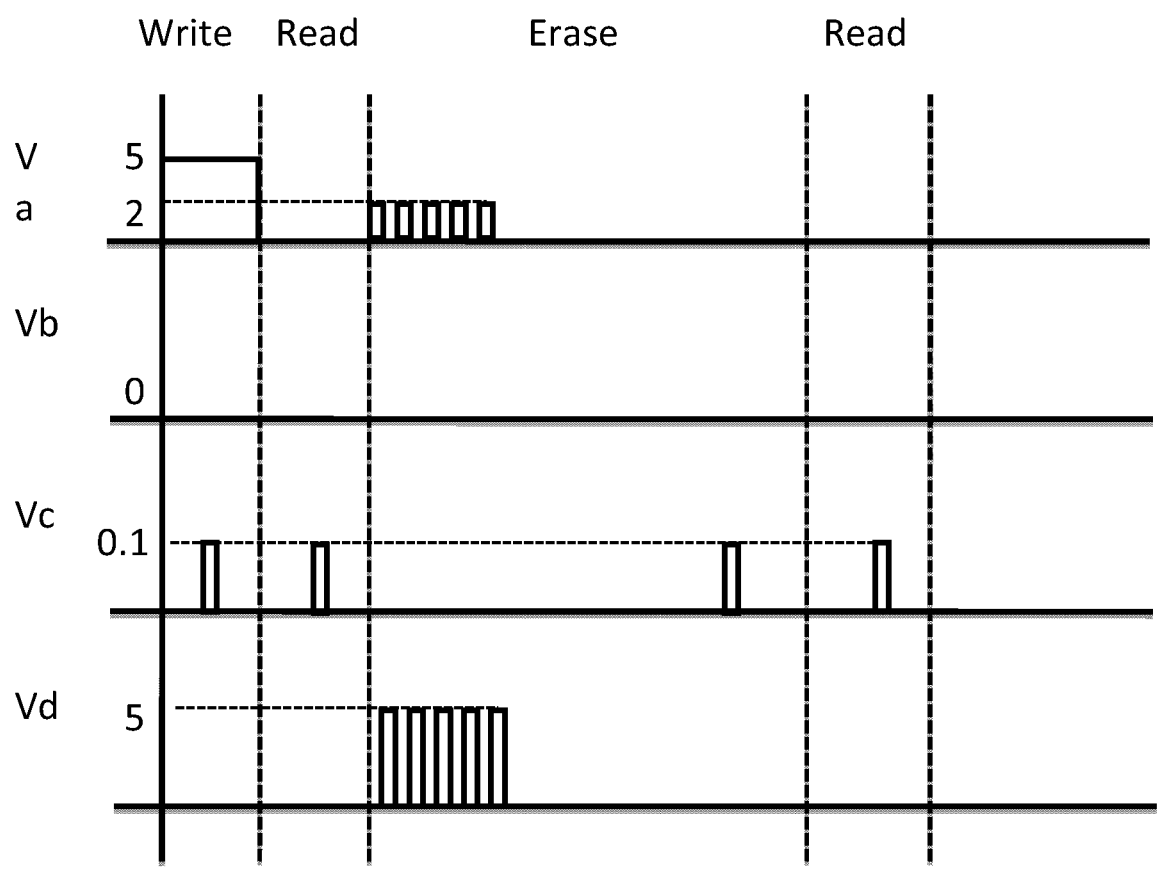
FIG. 7 shows a voltage application scheme according to another embodiment.

In FIG. 7, during the write stage, a voltage is applied to the pull down electrode. In the embodiment shown in FIG. 7, a constant voltage of 5V is applied to the pull down electrode, no voltage is applied to the switch or cantilever, no voltage is applied to the pull up electrode, and a short pulse of 0.1 volts is applied to the landing electrode while the constant voltage is applied to the pull down electrode. The time period that the voltage is applied to the landing electrode is much shorter than the time period that the constant voltage is applied to the pull down electrode. Additionally, the ratio of the voltage applied to the pull down electrode to the landing electrode is shown to be 50:1. It is to be understood that other ratios are possible as the particular voltages used in FIG. 7 are for exemplification purposes only. The purpose of the voltage applied to the landing electrode during the write stage is to place a current through the switch or cantilever and thus, write the device. During the write stage, the switch or cantilever is pulled into contact with the landing electrode.

During the read stage, a voltage pulse is applied to the landing electrode to measure the resistance through the switch or cantilever. No power is applied to the pull down electrode or the pull up electrode.

During the erase stage, the switch or cantilever is pulled from contact with the landing electrode. A pulsed voltage is applied to the pull up electrode to move the switch or cantilever from a position in contact with the landing electrode to a position spaced from the landing electrode. In the embodiment shown in FIG. 7, the pulsed voltage is cycled between 0V and about 5V for five pulses or cycles at a frequency of between about 15 MHZ to about 40 MHz. It is to be understood that more or fewer pulses may be used. The voltage applied to remove the switch or cantilever from the landing electrode is shown to be the same as the voltage that brings the switch or cantilever into contact with the landing electrode, however, a pulse is applied to the pull down electrode to aid in freeing the switch or cantilever from the landing electrode.

The voltage pulse applied to the pull down electrode is shown to cycle between 0V and about 2V for 5 pulses or cycles at a frequency between about 15 MHz to about 40 MHz. While five pulses have been shown, it is to be understood that more or less pulses may be used. The voltage pulse to the pull down electrode vibrates the switch or cantilever to move the switch or cantilever from a high state of adhesion with the landing electrode to a stage of lesser adhesion. The train of voltage pulses applied to the pull up electrode is 180 degrees out of phase with the pull down electrode during the erase stage.

A voltage is applied to the landing electrode after the switch or cantilever is believed to have been moved out of contact with the landing electrode to erase the device. Thereafter, the device is read by applying a small voltage to the landing electrode to measure the resistance. In each of the write, read, and erase stages, the voltage applied to the landing electrode is shown to be 0.1V, but it is to be understood that other voltages could be applied.

Figure 8:
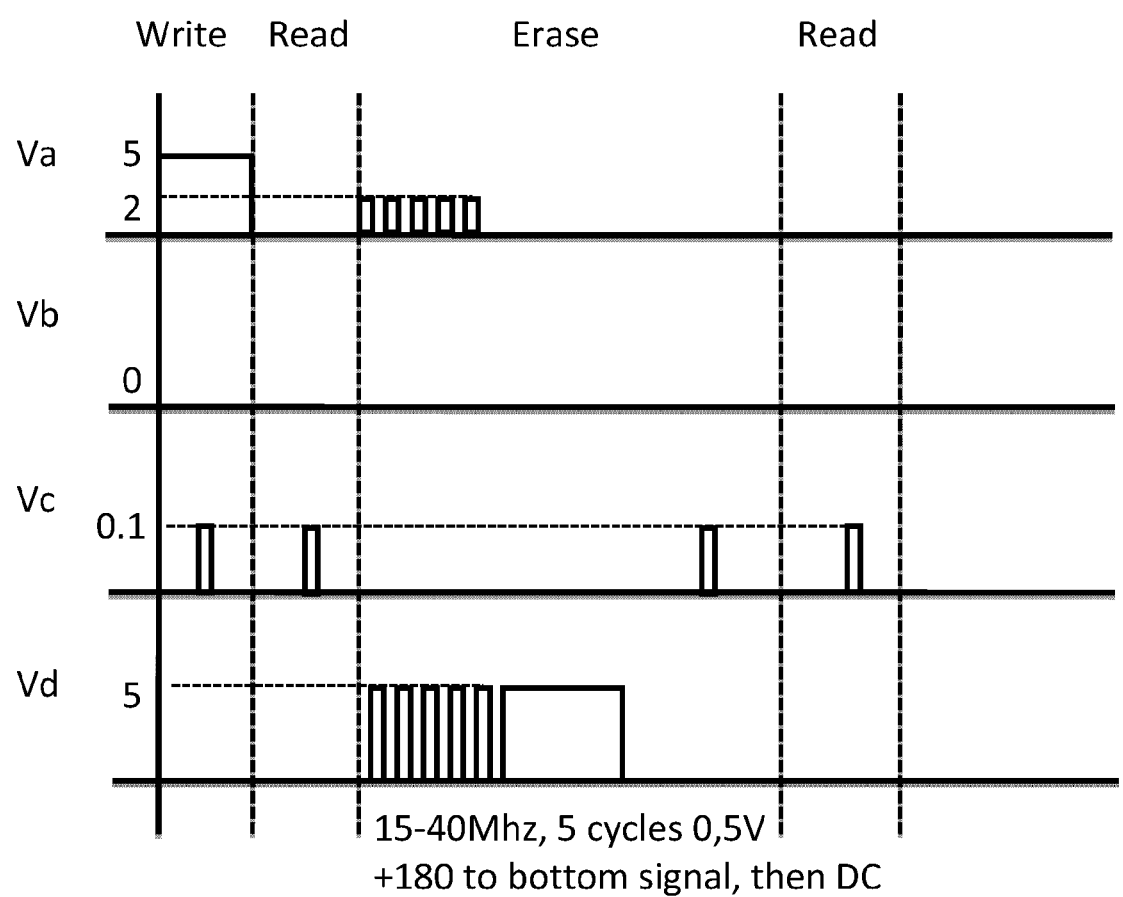
FIG. 8 shows a voltage application scheme according to another embodiment.

In FIG. 8, during the write stage, a voltage is applied to the pull down electrode. In the embodiment shown in FIG. 8, a constant voltage of 5V is applied to the pull down electrode, no voltage is applied to the switch or cantilever, no voltage is applied to the pull up electrode, and a short pulse of 0.1 volts is applied to the landing electrode while the constant voltage is applied to the pull down electrode. The time period that the voltage is applied to the landing electrode is much shorter than the time period that the constant voltage is applied to the pull down electrode. Additionally, the ratio of the voltage applied to the pull down electrode to the landing electrode is shown to be 50:1. It is to be understood that other ratios are possible as the particular voltages used in FIG. 8 are for exemplification purposes only. The purpose of the voltage applied to the landing electrode during the write stage is to place a current through the switch or cantilever and thus, write the device. During the write stage, the switch or cantilever is pulled into contact with the landing electrode.

During the read stage, a voltage pulse of is applied to the landing electrode to measure the resistance through the switch or cantilever. No voltage is applied to the pull down electrode or the pull up electrode.

During the erase stage, the switch or cantilever is pulled from contact with the landing electrode. A voltage is applied to the pull up electrode to move the switch or cantilever from a position in contact with the landing electrode to a position spaced from the landing electrode. In the embodiment shown in FIG. 8, a pulsed voltage is cycled between 0V and about 5V at a frequency between about 15 MHZ and about 40 MHz is applied to the pull up electrode. It is to be understood that while 5 voltage pulses have been shown, more or less pulses may occur. Following the voltage pulse, a constant voltage is applied to the pull up electrode for a time period longer than the time period that each individual pulse is applied. Additionally, the time period that the constant voltage is applied to the pull up electrode is longer than the individual pulses applied to the pull down electrode.

The voltage pulse applied to the pull down electrode is shown to cycle between 0V and about 2V for 5 pulses or cycles at a frequency between about 15 MHz to about 40 MHz. The voltage pulses applied to the pull down electrode are 180 degrees out of phase with the voltage pulses applied to the pull up electrode. The voltage pulses applied to the pull down electrode vibrates the switch or cantilever to move the switch or cantilever from a high state of adhesion with the landing electrode to a stage of lesser adhesion. It is to be understood that while 5 voltage pulses have been shown, more or fewer pulses may occur.

After the voltage pulses have been applied to the pull down electrode and the pull up electrode, the constant voltage of 5V is applied to the pull up electrode to pull the switch or cantilever from contact with the landing electrode. A voltage is applied to the landing electrode after the switch or cantilever is believed to have been moved out of contact with the landing electrode to erase the device. Thereafter, the device is read by applying a small voltage to the landing electrode to measure the resistance. In each of the write, read, and erase stages, the voltage applied to the landing electrode is shown to be 0.1V, but it is to be understood that other voltages could be applied.

Figure 9:
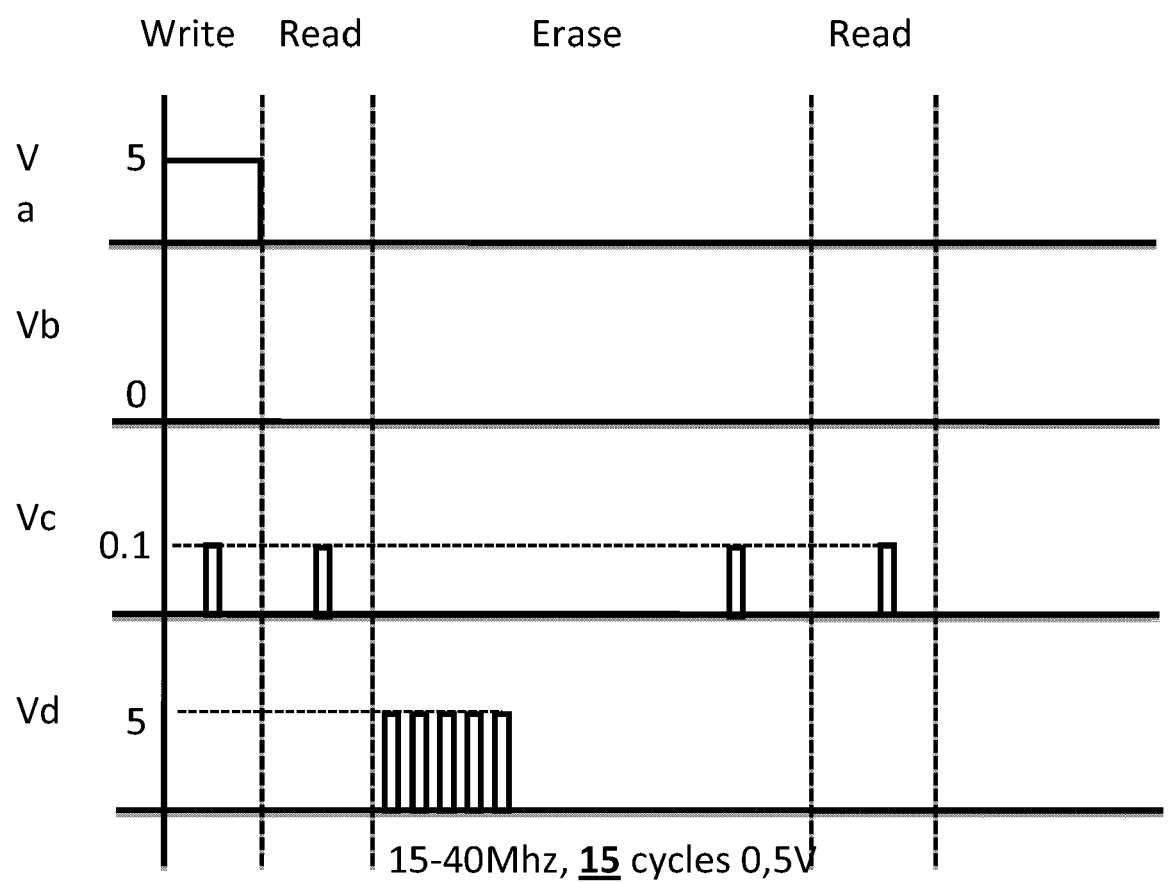
FIG. 9 shows a voltage application scheme according to another embodiment.

In FIG. 9, during the write stage, a voltage is applied to the pull down electrode. In the embodiment shown in FIG. 9, a constant voltage of 5V is applied to the pull down electrode, no voltage is applied to the switch or cantilever, no voltage is applied to the pull up electrode, and a short pulse of 0.1 volts is applied to the landing electrode while the constant voltage is applied to the pull down electrode. The time period that the voltage is applied to the landing electrode is much shorter than the time period that the constant voltage is applied to the pull down electrode. Additionally, the ratio of the voltage applied to the pull down electrode to the landing electrode is shown to be 50:1. It is to be understood that other ratios are possible as the particular voltages used in FIG. 9 are for exemplification purposes only. The purpose of the voltage applied to the landing electrode during the write stage is to place a current through the switch or cantilever and thus, write the device. During the write stage, the switch or cantilever is pulled into contact with the landing electrode.

During the read stage, a voltage pulse of is applied to the landing electrode to measure the resistance through the switch or cantilever. No power is applied to the pull down electrode or the pull up electrode.

During the erase stage, the switch or cantilever is pulled from contact with the landing electrode. A voltage is applied to the pull up electrode to move the switch or cantilever from a position in contact with the landing electrode to a position spaced from the landing electrode. In the embodiment shown in FIG. 9, a pulsed voltage cycling between 0V and about 5V is applied at a frequency of between about 15 MHz and about 40 MHz to the pull up electrode. The voltage to the pull up electrode may be applied for about 15 cycles. It is to be understood that more or less cycles may occur. The voltage applied to remove the switch or cantilever from the landing electrode is shown to be the same as the voltage that brings the switch or cantilever into contact with the landing electrode, however, the voltage applied to the pull up electrode is pulsed.

A voltage is applied to the landing electrode after the switch or cantilever is believed to have been moved out of contact with the landing electrode to erase the device. Thereafter, the device is read by applying a small voltage to the landing electrode to measure the resistance. In each of the write, read, and erase stages, the voltage applied to the landing electrode is shown to be 0.1V, but it is to be understood that other voltages could be applied.

Figure 10:
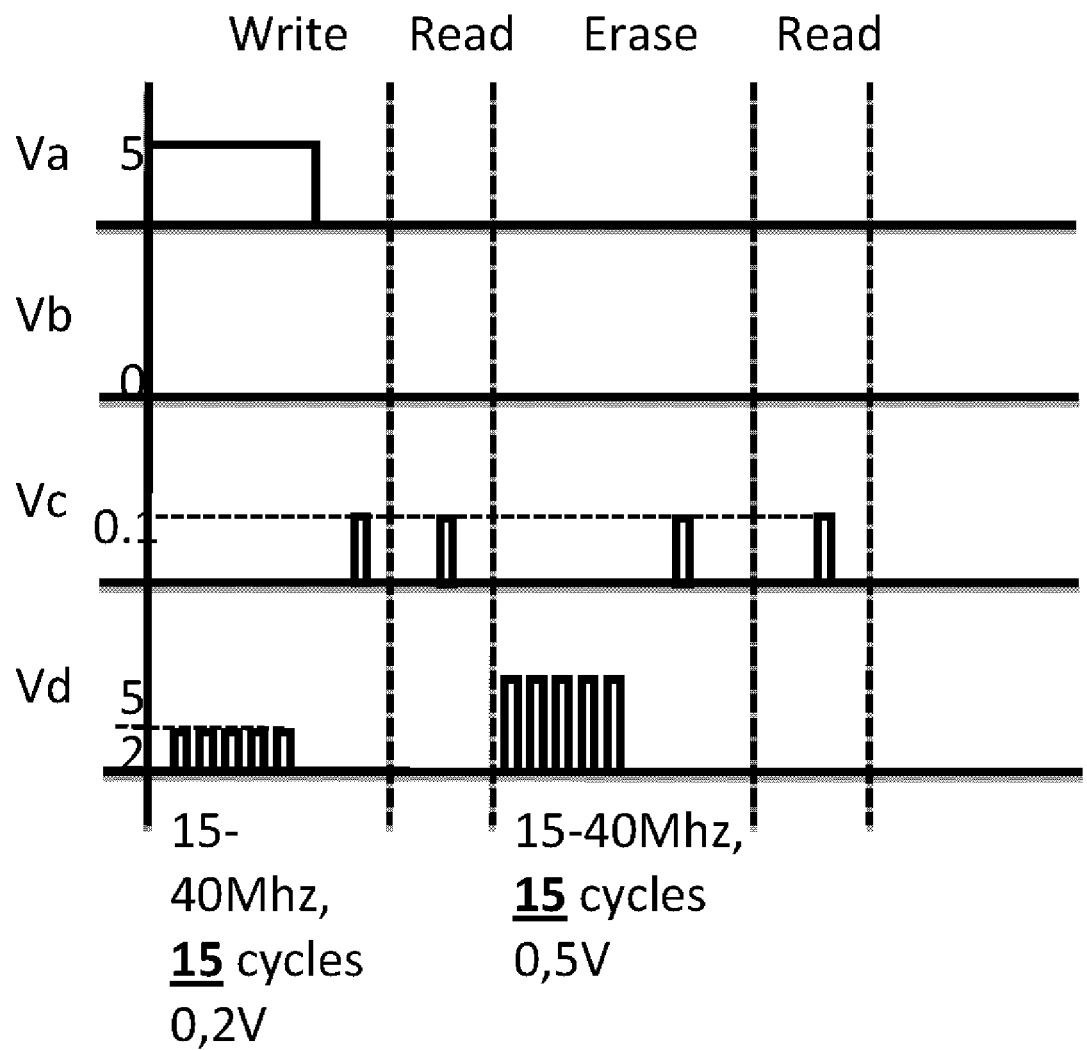
FIG. 10 shows a voltage application scheme according to another embodiment.

In FIG. 10, during the write stage, a constant voltage is applied to the pull down electrode. In the embodiment shown in FIG. 10, a constant voltage of 5V is applied to the pull down electrode, no voltage is applied to the switch or cantilever and a short pulse of 0.1 volts is applied to the landing electrode. Additionally, a voltage pulse is applied to the pull up electrode cycling between 0V and about 2V at a frequency between about 15 MHz to about 40 MHz. The pull up electrode may be cycled about 15 times. It is to be understood that more or fewer cycles may occur. The pulsed voltage to the pull up electrode may aid in moving the switch or cantilever to a position of greater adhesion.

The time period that the voltage is applied to the landing electrode is much shorter than the time period that the constant voltage is applied to the pull down electrode. Additionally, the ratio of the voltage applied to the pull down electrode to the landing electrode is shown to be 50:1. It is to be understood that other ratios are possible as the particular voltages used in FIG. 10 are for exemplification purposes only. The purpose of the voltage applied to the landing electrode during the write stage is to place a current through the switch or cantilever and thus, write the device. During the write stage, the switch or cantilever is pulled into contact with the landing electrode.

During the read stage, a voltage pulse is applied to the landing electrode to measure the resistance through the switch or cantilever. No power is applied to the pull down electrode or the pull up electrode. During the erase stage, the switch or cantilever is pulled from contact with the landing electrode. A voltage is applied to the pull up electrode to move the switch or cantilever from a position in contact with the landing electrode to a position spaced from the landing electrode. In the embodiment shown in FIG. 10, a pulse train cycling between 0V and about 5V is applied at a frequency between about 15 MHz and about 40 MHz for about 15 cycles to the pull up electrode. It is to be understood that more or less cycles may occur. The voltage applied to remove the switch or cantilever from the landing electrode is shown to be the same as the voltage that brings the switch or cantilever into contact with the landing electrode.

A voltage is applied to the landing electrode after the switch or cantilever is believed to have been moved out of contact with the landing electrode to erase the device. Thereafter, the device is read by applying a small voltage to the landing electrode to measure the resistance. In each of the write, read, and erase stages, the voltage applied to the landing electrode is shown to be 0.1V, but it is to be understood that other voltages could be applied.

While the cantilever has been discussed as moving between a position spaced from a landing electrode and a position in contact with a landing electrode below the cantilever by applying a voltage to a pull down electrode, it is to be understood that the landing electrode could be above the cantilever. The voltage pulses may be applied to either or both of the pull down and pull up electrodes. The voltage pulses may be applied prior to or in addition to the constant voltages. The voltage pulses may overlay constant voltages on the same electrode. The voltage pulses may be used to bring the cantilever into a state of lower adhesion with the landing electrode or into a state of higher adhesion with the landing electrode, depending upon the particular voltage arrangement. Additionally, it is contemplated that the voltage pulses could be applied over a constant voltage. Thus, the pulses of voltage may be used to excite a free-standing structure (i.e., a switch or cantilever) at its resonant frequency to more it between a high adhesion state to a low adhesion state. The frequency of pulses may match the fundamental mode of vibration of the cantilever or may match higher modes of vibration which lead to more movement at the contact that is being released. It may be advantageous to set use two trains of voltage pulses, one set to the fundamental resonant frequency of the stuck down cantilever an one set to a higher resonant mode. The combination of these two vibrational modes may result in greater forces being felt at the stuck down contact than would be felt if only one mode of vibration was excited.

As noted above, the resistance through the switch or cantilever may be measured to determine the level of adhesion. If the switch or cantilever is in a state of high adhesion, then the resistance should be low. If the switch or cantilever is in a state of low adhesion, then the resistance should be high relative to the high adhesion state.

During the read stage discussed above in relation to FIGS. 5-10, the resistance may be measured to determine the adhesion state. For a given device, the resistance for a low adhesion state and for a high adhesion state may be known in advance. The resistance is a function of the material and the geometry of the switch or cantilever. Thus, for a given material and a given shape of the switch or cantilever, the desired resistance for a low adhesion state and the desired resistance for a high adhesion state may be known in advance.

Therefore, when measured during the read period, the state of adhesion of the switch or cantilever to the landing electrode or contact area may be determined. By measuring the resistance, one would be able to ensure that the switch or cantilever has reached a new, low adhesion state so that the resonant signal may be turned off and the switch or cantilever may be permitted to pull out of contact with the landing electrode or contact area.

By measuring the resistance, better control of MEMS devices may occur. A technician can measure the resistance and ensure that switches or cantilevers that should remain in contact with the landing electrode or contact area remain in contact while switches or cantilevers that should move out of contact with the landing electrode of contact area do in fact move out of contact.

Figure 11A:
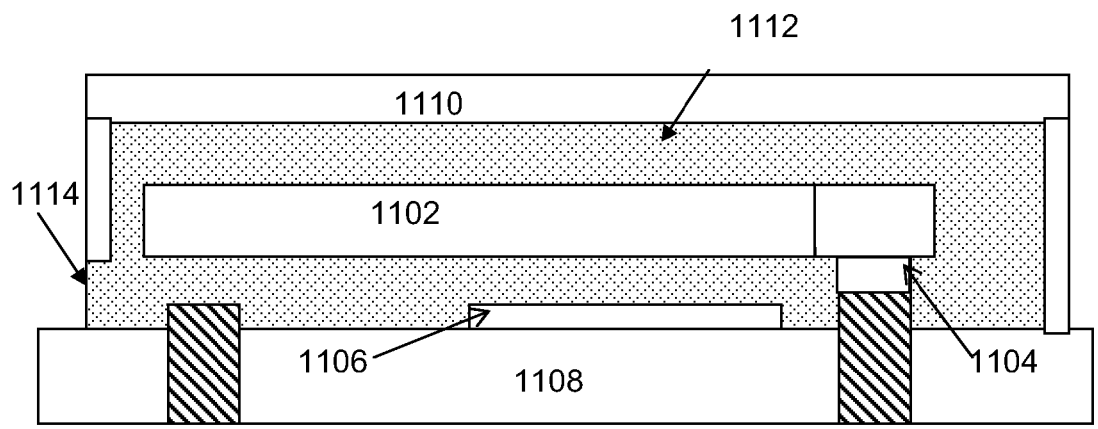
FIG. 11A shows a MEMS device with the switch or cantilever encased in sacrificial material.
Figure 11B:
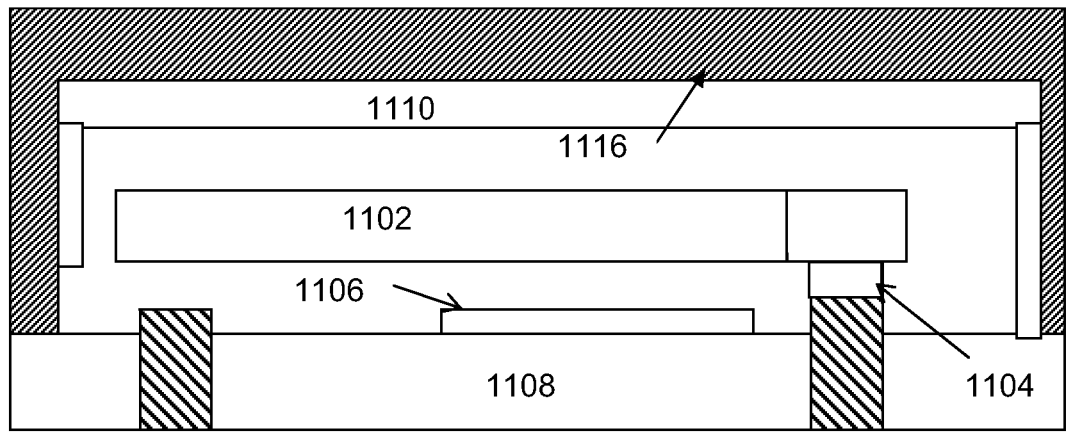
FIG. 11B shows the MEMS device of FIG. 11A with the sacrificial material removed and the cavity sealed.

A MEMS device, such as the one shown in FIGS. 11A and 11B may be fabricated by a multi-step process. The first step consists of using known CMOS process steps to fabricate a wafer up to a predetermined metal level within the CMOS BEOL. The CMOS BEOL comprises an inter-metal dielectric layer 1108 having metal channels therein. In one embodiment, the dielectric layer 1108 may comprise silicon dioxide. Vias are fabricated through the dielectric layer 1108 using known methods such as conventional lithography and etch processes. The vias connect the MEMS device to layers below the MEMS device. The vias may comprise a liner layer and a metal fill. In one embodiment, the liner may comprise titanium. In another embodiment, the liner may comprise titanium nitride. In one embodiment, the fill material may comprise tungsten. In another embodiment, the fill material may comprise copper. In another embodiment, the fill material may comprise aluminum. The vias may be capped with a titanium and/or titanium nitride layer. The titanium and/or titanium nitride layer may be patterned using conventional lithography and etch processes to form a plurality of electrodes, one of which will be the lower electrode of the MEMS cantilever device.

Next, one or more layers of sacrificial material 1112 may be coated on the wafer surface over the patterned electrodes such as the pull down electrode 1106. The thickness of the sacrificial material 1112 will be chosen to permit the operation of the device within the resulting cavity. In one embodiment, the sacrificial material 1112 may comprise a high temperature spin-on organic film. However, other spin-on films and Plasma Enhanced Chemical Vapor Deposition (PECVD) materials, such as silicon nitride, silicon dioxide, amorphous silicon and amorphous carbon, can be employed to the same effect. A spin on layer may flow over any irregularities in the underlying layers, thereby producing a flat layer where the thickness of the film depends on the height of the underlying material.

Then, a via structure may be patterned into the sacrificial material 1112 to form an interconnect from the underlying CMOS to the anchor 1104 of the device. Next, a conductive layer is deposited on top of the sacrificial material 1112. In one embodiment, the conductive layer may comprise titanium nitride. In other embodiments, the conductive layer may comprise a titanium aluminum compound, a titanium aluminum nitride compound, polysilicon, silicon, any conductive material, and combinations thereof. In another embodiment this layer may be made of a combination of conducting and insulating parts. The conductive layer will form the cantilever of the cantilever device. Once deposited, the conductive layer may be patterned using conventional lithography and etch processes in order to form the shape of the cantilever or switch 1102. In one embodiment, the conductive layer is patterned by depositing a photoresist layer thereon, exposing the photoresist, developing the photoresist, removing the developed (or undeveloped photoresist) to form a mask, and then exposing the conductive layer through the mask to an etchant to remove undesired portions of the conductive layer. Thereafter, the mask may be removed. In one embodiment, a hard mask may be used.

Then, more sacrificial material 1112 may be deposited in order to cover the patterned cantilever or switch 1102. The depositing of additional sacrificial material 1112 effectively seals the MEMS element prior to the creation of the micro-cavity. The additional sacrificial material 1112 may be deposited in a manner similar to the method of depositing the previously deposited sacrificial material 1112.

The sacrificial material 1112 may then be patterned to form the shape of the micro-cavity. The shape and dimensions of the patterned micro-cavity depend on the structure which is to be fabricated. The sacrificial material 1112 may be patterned by depositing conventional lithography and etching methods. For example, a photoresist layer may be deposited over the sacrificial material 1112. Then, the photoresist may be exposed and developed. Thereafter, the developed (or undeveloped) photoresist may be removed to form a mask. Then the second sacrificial material 1112 may be exposed to an etchant through the mask to remove undesired portions of the sacrificial material 1112.

Next, the CMOS BEOL flow is continued and the next layer or roof 1110 is deposited. The roof 1110 may comprise a metal or a dielectric material. The roof 1110 may be blanket deposited over the CMOS BEOL and the patterned sacrificial material 1112 followed by an etching process. In one embodiment, the roof 1110 may be pattern deposited through a mask. The roof 1110 may be in contact with one or more electrodes as well as the dielectric layer 1108. Prior to patterning the roof 1110, the roof 1110 may encapsulate the micro-cavity. Once deposited, the roof 1110 is then patterned and etched using conventional lithography and etch processes. Following the patterning and etching of the roof 1110, the roof 1110 may be in contact with an electrode outside of the cavity area to provide the electrical connection to metallization layers to be formed above the micro-cavity. Additionally, the roof 1110, after etching, may have one or more openings 1114 through the sidewalls that are filled with either the sacrificial material 1112. The opening 1114 in the sidewall permits an etchant to reach the micro-cavity and remove the sacrificial material 1112.

Next, the patterned sacrificial material 1112 may be removed from the wafer surface in order to leave the freestanding cantilever or switch 1102. In one embodiment, the sacrificial material 1112 may be removed using a dry plasma etch. In another embodiment, the sacrificial material 1112 may be removed using a wet etching process. It is to be understood that the sacrificial material 1112 may be exposed upon the patterning of the roof 1110 such that the etchant contacts the sacrificial material 1112 by an exposed top surface of the sacrificial material 1112 or through the opening 1114.

Next a sealing layer 1116 may be deposited to effectively seal the fabricated micro-cavity within the CMOS BEOL. The sealing layer 1116 may comprise silicon dioxide. The sealing layer 1116 seals any openings into the micro-cavity to encapsulate the cantilever or switch 1102. As will be appreciated, the final shape of the micro-cavity is dependent upon the structure which is to be contained within it. The height of the micro-cavity is less than the total height of the sealing layer 1116 such that the micro-cavity fits within the sealing layer 1116. Therefore, the micro-cavity may be formed in a structure without altering the process flow for later metallization layers. By fitting the micro-cavity within the sealing layer 1116, no additional processing above the sealing layer 1116 is necessary than would occur in absence of the micro-cavity. In some embodiments the cavity may take up a height of more than one interlayer dielectric where it lies on top of metal layer m and under metal layer m+2. The subsequent metal layers can then run on top undisturbed.

Because the adhesion at a contact that is dominated by metal-metal bonding is proportional to the resistance of that contact, it is possible to controllably obtain the weak adhesion state without allowing the cantilever to come off the landing electrode. These two adhesion states are spatially separated by a small amount that could be less than one nanometer. In order for these two adhesion states to be realized, the interfaces that come into contact must be rough on some scale which could be the nanometer scale. The asperities can have high hardness values so that the pressure created at asperity 202 is less than the elastic limit when the surfaces are brought close enough so that asperities 204 come into contact. Materials that have a high Young's modulus and high values of hardness are the refractory metals. Metals like titanium nitride also have oxides that can be conductive.

In order to prevent the surfaces from becoming oxidized, the MEMS devices can be manufactured in a way that ensures that the released switch or cantilever never sees an oxygen atmosphere. This can be achieved by etching away the sacrificial material 1112 used to support the MEMS cantilever or switch 1102 during manufacture (which lies between the cantilever contact and the landing electrode) using a plasma etch that does not contain oxygen. By ensuring that the etch occurs through a hole 1114 in the walls and/or roof 1110 of a cavity housing, and then without bringing the wafer up to air, sealing layer 1116 is deposited in a low pressure environment, sealing the hole 1114 from letting air enter in subsequent processing steps.

Because the high-resistance, low-adhesion state corresponds to an increased number of asperity contacts, the resistance of the contact is reduced. Thus, there is a close relation between the adhesion energy and the contact resistance. For a given contact material deposited with an average surface roughness, there can be a well defined correlation between adhesion and contact resistance.

The high-resistance, low-adhesion state can be calibrated by measuring the resistance between the cantilever and the landing electrode that corresponds to an adhesion which would allow the cantilever to be pulled off with a low voltage applied to roof. The low-resistance high-adhesion contact state can also be achieved controllably by monitoring the contact resistance as a function of increasing pull-in voltage, or DC pull-in voltage combined with a pulse train set to the period of oscillation of the cantilever in the stuck down state.

For example a cantilever 300 nm thick with a width of 1 micron and a length of 2 microns titanium nitride may have a first resonant frequency of around 20 MHz when the end of the cantilever is touching the landing electrode. A pulse train could have between 2 and 100 pulses with an amplitude between 2 and 6 volts. Each pulse would be between 10 and 30 nanoseconds long with a spacing between 10 and 30 nanoseconds. The period from between the start of each pulse would then be 50 nanoseconds. It can be advantageous to excite more than one mode or vibration in the cantilever, using a series of pulse whose period match into these resonant modes. This can provide a number of different motions of the cantilever which may combine vertical and lateral forces to the asperities to help break them apart in a controllable manner.

Figure 12:
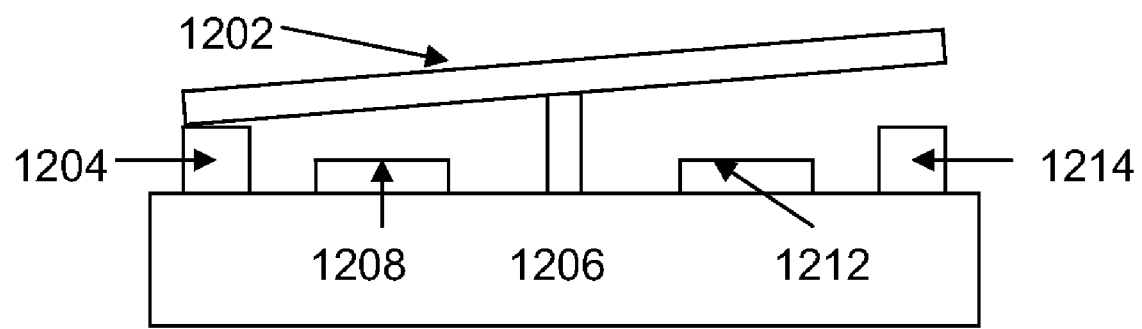
FIG. 12 is a schematic cross sectional view of a MEMS device according to another embodiment.

It should be pointed out that the techniques described herein have referenced a cantilever, but the techniques could also work for a rocking cantilever as shown in FIG. 12. FIG. 12 is a schematic cross sectional view of a MEMS device according to another embodiment formed on a substrate 1206. The device includes a rocking plate 1202 that rotates about a central support or pivot contact 1210. The device has two stable states. One state is being stuck to a landing electrode 1204 to the left of the pivot contact 1210 and the other state is being stuck to the landing electrode 1214 to the right of the pivot contact 1210. A pull-in electrode 1208 on the left of the pivot contact 1210 lies between the pivot contact 1210 and the landing electrode 1204. Another pull-in electrode 1212 to the right of the pivot contact 1210 lies between the pivot contact 1210 and the landing electrode 1214.

The pull-in electrodes 1208, 1212 may be used to provide an initial voltage to pull the rocker plate 1210 into contact with either of landing electrode 1204 or landing electrode 1214. Thereafter, one or more pulses of voltage may be applied to the corresponding pull-in electrode 1208, 1212 to pull the rocker plate 1202 into greater contact with the corresponding landing electrode 1204, 1214. Thereafter, one or more additional pulses of voltage may again be applied to the corresponding pull-in electrode 1208, 1212 to move the rocker plate 1202 into a state of less adhesion. Then, voltage may be applied to the opposite pull-in electrode 1208, 1212 (which acts in effect as a pull-off electrode), to pull the rocker plate 1202 out of contact with the landing electrode 1204, 1214.

In one example of using the MEMS device of FIG. 12, a first voltage may initially be applied to the pull-in electrode 1208 to move the rocker plate 1202 from a location spaced from the landing electrode 1204 to a position in contact with the landing electrode 1204. The resistance through the rocker plate 1202 may be measured. Thereafter, one or more pulses of voltage may be applied to the pull-in electrode 1208 to pull the rocker plate 1202 into even greater contact with the landing electrode 1204. The resistance through the rocker plate 1202 may then be measured. Then, a voltage may be applied to the pivot contact 1210 to program the MEMS device. Thereafter, one or more additional pulses of voltage may be applied to the pull-in electrode 1208 to move the rocker plate 1202 to a position of less adhesion with the landing electrode 1204. The resistance through the rocker plate 1202 may be measured to confirm the adhesion state. Then, voltage may be applied to the pull-in electrode 1212 (acting as a pull-off electrode) to pull the rocker plate 1202 out of contact with the landing electrode 1204. Thereafter, voltage may be applied through the rocker plate 1202 to deprogram the device.

Additionally, a voltage may be applied to the pull-in electrode 1212 to bring the rocker plate 1202 into contact with the landing electrode 1214. The resistance through the rocker plate 1202 may then be measured. One or more pulses of voltage may be applied to the pull-in electrode 1212 to bring the rocker plate 1202 into greater adhesion with the landing electrode 1214. The resistance may be measured again to confirm the adhesive state and the device may be programmed. Thereafter, one or more pulses of voltage may be applied to the pull-in electrode 1212 to move the rocker plate 1202 into a state of less adhesion with the landing electrode 1214. The resistance through the rocker plate 1202 may be measured to confirm the adhesive state. A voltage may be applied to the pull-in electrode 1208 (acting as a pull-off electrode) to move the rocker plate 1202 out of contact with the landing electrode 1214. Thereafter, a voltage may be applied through the rocker plate 1202 to deprogram the device.

In another example, a first voltage may initially be applied to the pull-in electrode 1212 to move the rocker plate 1202 from a location spaced from the landing electrode 1214 to a position in contact with the landing electrode 1214. The resistance through the rocker plate 1202 may be measured. Thereafter, one or more pulses of voltage may be applied to the pull-in electrode 1212 to pull the rocker plate 1202 into even greater contact with the landing electrode 1214. The resistance through the rocker plate 1202 may then be measured. Then, a voltage may be applied to the pivot contact 1210 to program the MEMS device. Thereafter, one or more additional pulses of voltage may be applied to the pull-in electrode 1212 to move the rocker plate 1202 to a position of less adhesion with the landing electrode 1214. The resistance through the rocker plate 1202 may be measured to confirm the adhesion state. Then, voltage may be applied to the pull-in electrode 1208 (acting as a pull-off electrode) to pull the rocker plate 1202 out of contact with the landing electrode 1214. Thereafter, voltage may be applied through the rocker plate 1202 to deprogram the device.

Additionally, a voltage may be applied to the pull-in electrode 1208 to bring the rocker plate 1202 into contact with the landing electrode 1204. The resistance through the rocker plate 1202 may then be measured. One or more pulses of voltage may be applied to the pull-in electrode 1208 to bring the rocker plate 1202 into greater adhesion with the landing electrode 1204. The resistance may be measured again to confirm the adhesive state and the device may be programmed. Thereafter, one or more pulses of voltage may be applied to the pull-in electrode 1208 to move the rocker plate 1202 into a state of less adhesion with the landing electrode 1204. The resistance through the rocker plate 1202 may be measured to confirm the adhesive state. A voltage may be applied to the pull-in electrode 1212 (acting as a pull-off electrode) to move the rocker plate 1202 out of contact with the landing electrode 1204. Thereafter, a voltage may be applied through the rocker plate 1202 to deprogram the device.

By utilizing a pulse train to an electrode, the switch or cantilever may be brought into a different adhesion state, as desired, to either increase the stiction or decrease the stiction between the cantilever or switch and the landing electrode. Thus, less voltage may be used to remove the switch or cantilever from contact with the landing electrode or, alternatively, less voltage may be used to bring the switch or landing electrode into greater contact with the landing electrode.

While the foregoing is directed to embodiments of the present invention, other and further embodiments of the invention may be devised without departing from the basic scope thereof, and the scope thereof is determined by the claims that follow.

The invention claimed is:

1. A method of moving a switch in a micro-electromechanical device, comprising:
    applying one or more pulses of first voltage to a first electrode to move the switch from a first position in contact with a second electrode to a second position different than the first position and in contact with the second electrode while maintaining the switch in contact with the second electrode during the moving, the one or more pulses of first voltage each applied for a first period of time; and
    applying a second voltage to a third electrode disposed above the first electrode and the switch to move the switch from the second position to a third position spaced from the second electrode, the second voltage applied for a second period of time that is greater than the first period of time.

2. The method of claim 1, wherein stiction between the first electrode and the switch is lower when the switch is in the second position as compared to the first position.

3. The method of claim 1, wherein the one or more pulses comprises a plurality of pulses and the plurality of pulses are separated such that a frequency of the pulses is substantially equal to a resonant frequency of the switch.

4. The method of claim 1, wherein the switch comprises a cantilever coupled to an anchor point, the second electrode comprises a landing electrode, and the first electrode comprises a pull down electrode disposed between the landing electrode and the anchor point and spaced from the cantilever.

5. The method of claim 1, wherein the voltage of the second voltage is insufficient to move the switch from the first position to the third position.

6. The method of claim 1, wherein the one or more pulses of first voltage are insufficient to move the switch from the second position to the third position.

7. The method of claim 1, further comprising:
applying a fourth voltage for a fourth period of time to a first electrode to move the switch from the third position to the second position; and
applying one or more pulses of a fifth voltage to the first electrode to move the switch from the second position to the third position while maintaining the switch in contact with the second electrode during the moving, each pulse applied for a fifth period of time less than the fourth period of time.

8. A method of operating a MEMS device, comprising:
applying a first voltage to a first electrode to move a switch from a first position spaced from landing area and a second position in contact with the landing area;
measuring the resistance through the switch at the second position;
applying a second voltage to the first electrode to move the switch from the second position to a third position still in contact with the landing area and different than the second position; and
measuring the resistance through the switch at the third position.

9. The method of claim 8, wherein the resistance through the switch at the second position is higher than the resistance through the switch at the third position.

10. The method of claim 9, wherein the second voltage is applied in a series of pulses.

11. The method of claim 10, wherein the frequency of the series of pulses is equal to the resonant frequency of the switch.

12. The method of claim 8, further comprising:
applying a third voltage to the first electrode to move the switch from the third position to a fourth position; and
measuring the resistance through the switch at the fourth position.

13. The method of claim 12, wherein the resistance through the switch at the fourth position is greater than the resistance through the switch at the third position.

14. The method of claim 13, wherein the third voltage is applied as a series of pulses.

15. The method of claim 14, wherein the series of pulses is equal to the resonant frequency of the switch.

16. A method of operating a MEMS device, comprising:
applying a first voltage to a first pull-in electrode to bring a rocker plate into contact with a first landing electrode, the MEMS device comprising:
the rocker plate coupled to a pivot contact;
the first landing electrode spaced from the pivot contact;
the first pull-in electrode disposed between the pivot contact and the first landing electrode;
a second landing electrode spaced from the pivot contact; and
a second pull-in electrode disposed between the pivot contact and the second landing electrode;
measuring the first resistance through the rocker plate;
applying one or more pulses of a second voltage to the first pull-in electrode;
measuring the second resistance through the rocker plate;
applying one or more pulses of a third voltage to the first pull-in electrode;
measuring the third resistance through the rocker plate; and
applying a fourth voltage to the second pull-in electrode to move the rocker plate out of contact with the first landing electrode.

17. The method of claim 16, wherein the pivot contact is disposed between the first pull-in electrode and the second pull-in electrode.

18. The method of claim 17, the one or more pulses of the second voltage comprises a plurality of pulses and the plurality of pulses are separated such that a frequency of the pulses is substantially equal to a resonant frequency of the rocker plate.

19. The method of claim 16, wherein the second resistance is higher than the first resistance through the rocker plate.

20. The method of claim 16, further comprising applying a fifth voltage to the second pull-in electrode to bring the rocker plate into contact with the second landing electrode.

* * * * *